United States Patent [19]

Brody

[11] 4,360,896
[45] Nov. 23, 1982

[54] WRITE MODE CIRCUITRY FOR PHOTOVOLTAIC FERROELECTRIC MEMORY CELL

[75] Inventor: Philip S. Brody, Brookmont, Md.

[73] Assignee: The United States of America as represented by the Secretary of the Army, Washington, D.C.

[21] Appl. No.: 230,177

[22] Filed: Jan. 30, 1981

[51] Int. Cl.³ .............................................. G11C 11/22
[52] U.S. Cl. .................................................... 365/145
[58] Field of Search ................ 365/109, 145, 147, 215

[56] References Cited

U.S. PATENT DOCUMENTS 4,144,591  3/1979  Brody .................................. 365/228

*Primary Examiner*—George G. Stellar
*Attorney, Agent, or Firm*—Nathan Edelberg; Robert P. Gibson; Saul Elbaum

[57] ABSTRACT

Non-volatile semiconductor matrix random access and electrically alterable programmable read-only memories are disclosed. Each memory cell of the matrix memory includes a photovoltaic ferroelectric element which is remanently polarized with a write signal, and which when illuminated, produces a photovoltage which causes a field effect transistor to assume one of two states. Variable impedance means, for example, at least a diode or a breakdown diode is connected in each cell for providing a low impedance when the write gate pulse is applied to the photovoltaic ferroelectric element and for providing a high impedance when the photovoltage produced by the photovoltaic ferroelectric element is applied to the field effect transistor gate. If power to the memory is lost, by illuminating the photovoltaic ferroelectric element, the field effect transistor may be caused to assume the state which it was in before loss of power.

10 Claims, 6 Drawing Figures

WRITE MODE CIRCUITRY FOR PHOTOVOLTAIC FERROELECTRIC MEMORY CELL

The invention described herein may be manufactured, used, and licensed by or for the United States Government for governmental purposes without the payment to me of any royalty thereon.

The present invention is directed to improve semiconductor random access memories and electrically alterable programmable read-only memories and in particular, to such memories which are non-volatile and which do not have the disadvantages of prior art memories.

Typical non-destructive read-out semiconductor random access memories (RAM) of the prior art use capacitive charge storage on the gate of an insulated gate field effect transistor (IGFET) to control the source-drain channel resistance of the IGFET which serves as the sense transistor. Reading is accomplished by the non-destructive determination of the transistor state with an input read data pulse.

Such prior art semiconductor memories are volatile. During normal operation, the gate charge which would normally decay by leakage is maintained by a periodic refresh operation. However, if electrical power is interrupted, there is no refresh operation and the information in the memory is lost. As is known to those in the art, it is frequently desirable to have a non-volatile semiconductor memory which can withstand power interruption or which can be removed un-powered from the system in which it is installed and shipped with stored information. While non-volatile semiconductor memories utilizing semi-permanent charge storage within the gate structure of an IGFET rather than simple capacitive charge storage are available, these devices are limited in their utility for several reasons. For example, they retain information only for limited lengths of time, as at room temperature maximum retention times are typically five years or less while at elevated temperatures retention times are much reduced. Also, presently available devices are sensitive to ionizing radiation which penetrates to the gate region producing electron-hole pairs and causing internal conductivity which drains away the stored charge. Further, the voltage pulses which are required to produce reasonably useful storage time are very long in duration when compared to normal write times for typical volatile dynamic RAMs. For example, erase times are typically ten milli-seconds or more while read pulses of one milli-seconds or more are required, resulting in cycle times of eleven milli-seconds or so, while conventional dynamic volatile RAMs in comparison have cycle times of the order at one micro-second.

Thus, the long cycle times required make it impractical to use these devices as non-volatile random access memories. The presently available devices are practically used only in a pre-programmed or block programmed mode as electrically alterable programmable read-only memories (EAPROM).

U.S. Pat. No. 4,144,591 to Brody discloses a memory transistor and a flip-flop memory cell wherein a photovoltaic-ferroelectric element is connected to the control element of a semiconductor device. The photovoltaic-ferroelectric element is remanently polarized in one of two directions depending upon the information to be stored and upon being illuminated biases the semiconductor device into one of two states. If power is lost, the remanent polarization in the photovoltaic-ferroelectric element continues to be stored, and upon illumination will again be effective to appropriately bias the semiconductor device. The present invention builds upon the basic teaching of U.S. Pat. No. 4,144,591 to provide practically realizable non-volatile semiconductor matrix memory devices which may be rapidly addressed.

It is thus an object of the present invention to provide non-volatile semiconductor memories which do not have the disadvantages of prior art devices.

It is a further object of the invention to provide non-volatile semiconductor matrix memories which can be rapidly programmed.

It is a further object of the invention to provide non-volatile semiconductor matrix memories which can be read immediately after information has been written therein.

It is a further object of the invention to provide non-volatile semiconductor matrix memories which retain information much longer than prior art devices, even at elevated temperatures.

It is still a further object of the invention to provide non-volatile semiconductor matrix memories which are insensitive to ionizing radiation.

The invention will be better understood by referring to the accompanying drawings in which.

Figure 1:
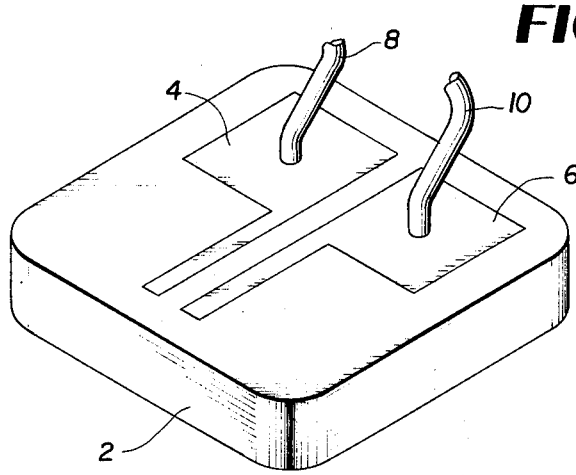
FIG. 1 is a pictorial illustration of a photovoltaic-ferroelectric element which may be used in the invention.

FIG. 1 depicts photovoltaic-ferroelectric substrate 2 having metallic electrodes 4 and 6 disposed thereon. Substrate 2 is made of ferroelectric ceramic material and has the property of storing a remanent polarization in a direction dependent upon the direction of an applied electric field and of a magnitude which is proportional to the intensity of the applied field. Upon being illuminated, the ferroelectric ceramic generates a voltage which is proportional to the stored remanent polarization of a polarity dependent upon the direction of the stored polarization. The properties of ferroelectric ceramics as well as suitable materials which may be used are well documented in U.S. Pat. No. 4,051,465 to Philip S. Brody, which is incorporated herein by reference.

Figure 2:
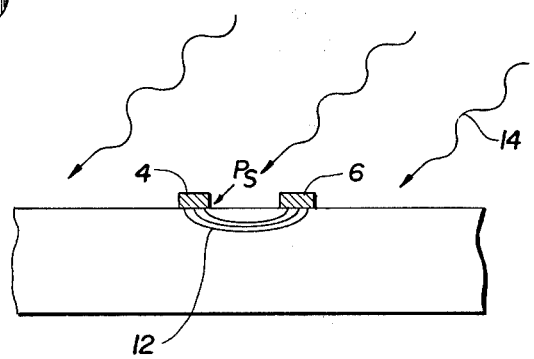
FIG. 2 is a cross-sectional view of the element of FIG. 1 and illustrates the electric field which is created in the element.

Referring to FIG. 1, a voltage applied to electrodes 4 and 6 via leads 8 and 10 respectively results in a fringing field within the substrate which polarizes the region between the electrodes. The fringing field is illustrated at 12 in FIG. 2, and in the presence of radiation, illustrated at 14 in FIG. 2, a photo-emf is produced between the electrodes. In the nomenclature of photoconductivity, the configuration illustrated in FIGS. 1 and 2 is called "transverse" while a "longitudinal" structure, which in principle also could be used to effect the invention, is one in which the remanent polarization is perpendicular to the surface of the substrate and in which the photo-emf is developed by illumination through a transparent electrode.

Figure 3:
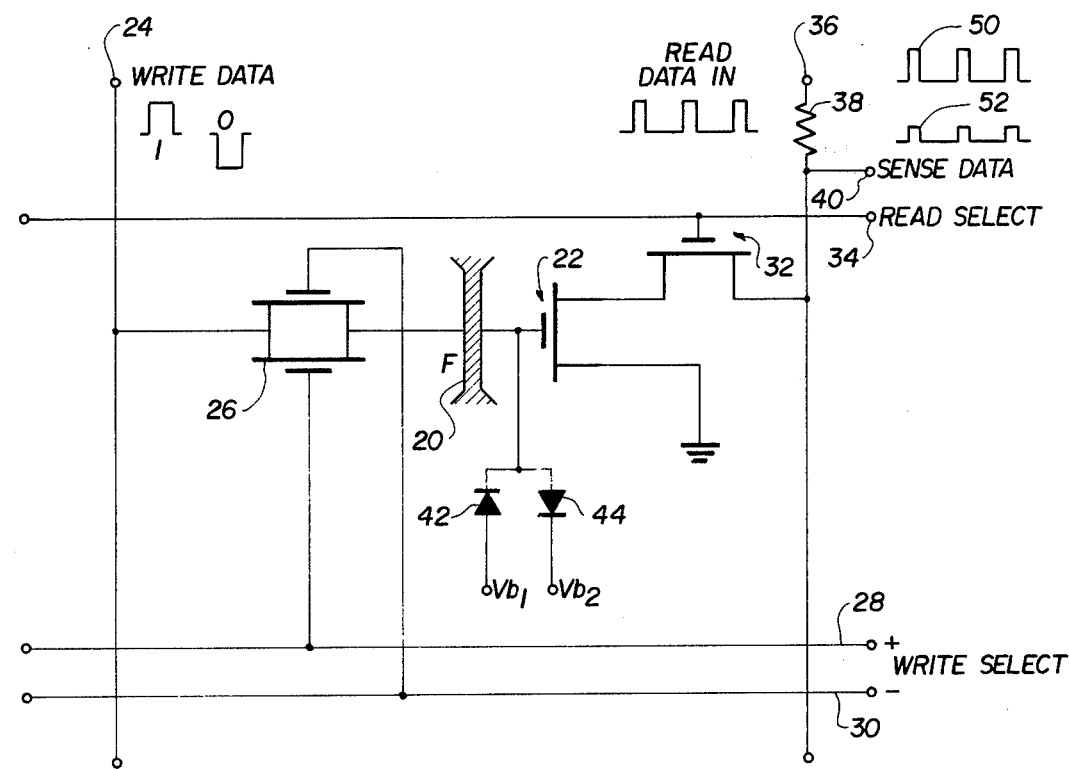
FIG. 3 is a schematic diagram of a RAM memory cell in accordance with an embodiment of the invention.

FIG. 3 shows a read-write RAM memory cell in accordance with an embodiment of the invention. Referring to the Figure, the photovoltaic-ferroelectric element 20 is connected to the control element of a sense semiconductor device, which in the case of the embodiment of FIG. 3 is an n channel IGFET 22.

The other electrode of the photovoltaic-ferroelectric element is connected to a write data terminal 24 through bilateral switch means 26. As known to those skilled in the art, the bilateral switch is comprised of a n FET pair. Additionally, positive and negative write select lines 28 and 30 are connected to respective inputs of the bilateral switch, and read transistor 32 is connected in series with sense transistor 22, with the gate of the read transistor being connected to read select terminal 34. Read data is read in at terminal 36, and resistor 38 connects the terminal with the drain of read transistor 32, while output data is sensed at sense terminal 40. Finally, diodes 42 and 44 which in the preferred embodiment are junction FET based low leakage diodes are reverse biased by biasing sources $Vb_1$ and $Vb_2$, and are connected at the gate of transistor 22 and ground.

To write data into the memory cell, a "1" pulse or a "0" pulse is applied to terminal 24 while a positive and negative write select signal is applied to terminals 28 and 30. The write select terminals are then connected to the control electrodes of bilateral switch means 26 and permit the data pulse to be fed through to photovoltaic-ferroelectric element 20.

In the operation of the device, assuming that the remanent polarization in element 10 is pre-existing in a direction towards the transistor gate, when a "0" or negative pulse is applied to terminal 24, it will cause the direction of remanent polarization to switch so that it is directed away from the gate. Upon being illuminated, element 20 generates a photovoltage in a direction which causes the field effect transistor channel to become conducting.

In accordance with the present invention, variable impedance means is connected in the circuit for attaining a low impedance when the write data pulse is applied to the photovoltaic-ferroelectric element and for attaining a high impedance when the photovoltage produced by the photovoltaic-ferroelectric element is applied to the transistor gate. In the embodiment of FIG. 3, the variable impedance means comprises diodes means 42 and 44, which are connected to biasing means $Vb_1$ and $Vb_2$ respectively. The biasing voltages are arranged so that one diode is forward biased and forms a low impedance path when the relatively high write voltages are applied, thus ensuring that a high enough voltage is applied to element 20 to switch the remanent polarization, but so that both diodes are reverse biased, thus forming a high impedance path when the photovoltage output of element 20, which typically has a magnitude of only a few volts is applied to the transistor gate. Thus, for example, reverse bias voltages $Vb_2$ is of a value such that a "1" write pulse would cause the diode to be forward biased, but the relatively small photovoltage output of cell 20 upon illumination would not be great enough to change the reverse biased condition of the diode to a forward bias. The value of reverse bias voltage $Vb_1$ is similarly selected to cause diode means 42 to function similarly for a "0" write data pulse.

In order to read the information stored in the memory cell, a read data pulse is applied at terminal 26. If a "1" is stored in sense transistor 22, then the transistor assumes an "off" or high impedance state and a high pulse 50 is sensed at sense data terminal 40 while if a "0" is stored and sense transistor 22 is in an "on" or low impedance state, then a low pulse 52 is sensed.

The memory cell can be read immediately after it is written into. A charge is generated by the write pulse on the gate of sense transistor 22 by voltage division between the parasitic element capacitance and the gate capacitance. This charge is equal approximately to $CgVb_1$ or $CgVb_2$ where $Vb_1$ and $Vb_2$ are the diode biases and Cg is the gate to ground capacitance. This charge decays through the diode back resistances until the voltages at gate equal the photo-emf shifted bias voltage. The gate voltage never decays below the memory bias voltage, provided an adequate photocurrent flows. The effect is to allow the logic "1" or "0" to be read immediately after write.

While the variable impedance means illustrated in connection with the embodiment of FIG. 3 comprises diodes, other non-linear impedance means which perform a similar function may be used, and are within the scope of the present invention. For example, the diodes can be replaced by a pair of back-to-back breakdown diodes or by a single breakdown diode, for example, of the Shottkey type, which would conduct in the breakdown mode for one of the write polarities. Further, as explained below, the input diode of a JFET could be used for this purpose.

It should further be appreciated that other, similar configurations can accomplish the same functions as the specific memory cells shown in FIG. 3. For example, instead of a n channel sense transistor, a p channel sense transistor can be used with a positive write pulse producing a "0" read output, or a JFET can be used instead of an IGFET for the sense transistor 22. Additionally, if required by the particular sense transistor and ferroelectric ceramic used, a biasing voltage can be inserted in series with the ferroelectric ceramic element and the bilateral switch.

As mentioned above, the memory illustrated in FIG. 3 is non-volatile. Thus, if power is lost, and the information stored in the sense transistor ceases to exist, upon illumination of the photovoltaic ferroelectric element the sense transistor will again store the correct information.

Figure 4:
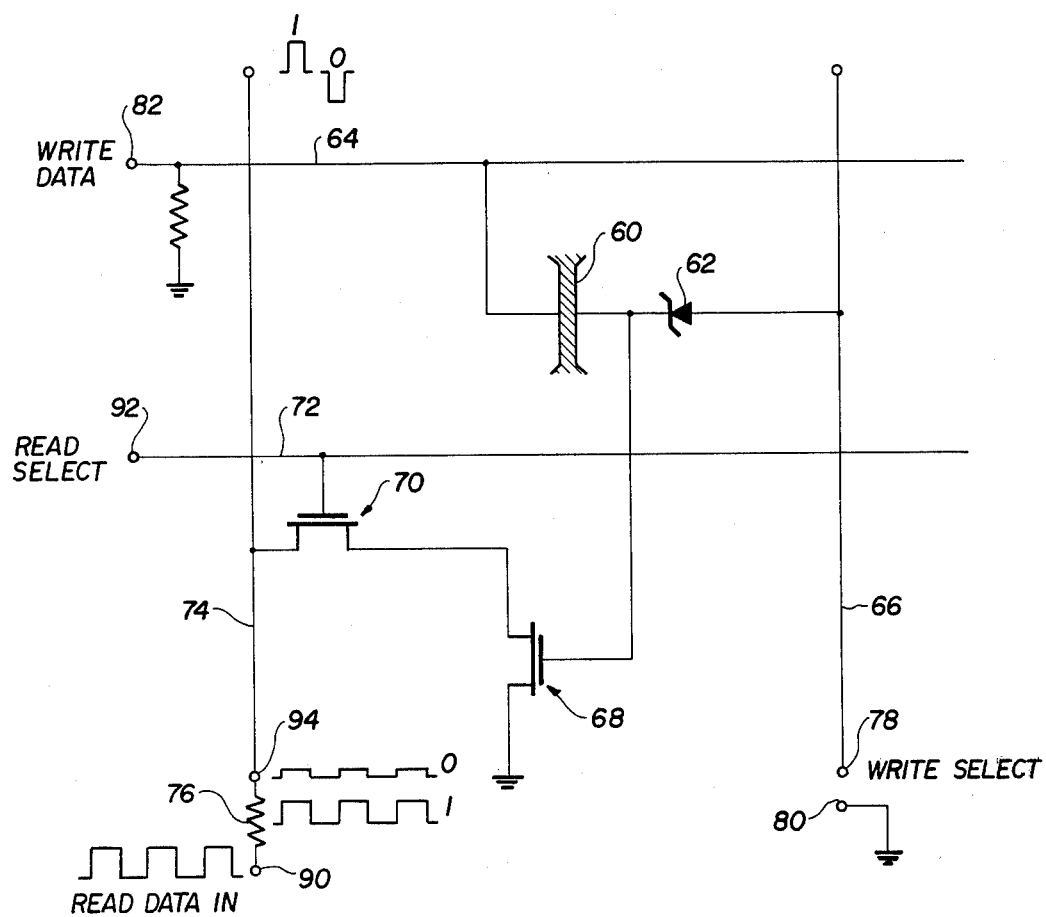
FIG. 4 is a schematic diagram of an EAPROM memory cell in accordance with a further embodiment of the invention.

FIG. 4 illustrates an embodiment of the invention which may be utilized as EAPROM memory. It does not include the switching transistors of the RAM embodiment of FIG. 3 and is not designed to be read immediately after write. Additionally, the specific embodiment shown in FIG. 4 utilizes a single breakdown diode in place of the back-to-back conventional diodes utilized in the embodiment of FIG. 3.

Referring to FIG. 4, the series combination of photovoltaic ferroelectric element 60 and breakdown diode 62 is connected between horizontal matrix write data line 64 and vertical matrix write select line 66. The gate of sense transistor 68 is connected to the interconnection of photovoltaic ferroelectric element 60 and breakdown diode 62, and read transistor 70 is connected in series with the sense transistor. Horizontal matrix reads select line 72 is connected to the gate of the read transistor, the source or drain of which is connected to the vertical matrix read line 74 which includes resistor 76.

In order to write data into the memory cell, write select line 66 is grounded by connecting terminals 78 and 80 to each other and a "1" or "0" pulse is inputted at terminal 82, which is effective to switch the polarization of photovoltaic ferroelectric element 60. Upon illumination, sense transistor 68 is caused to be biased in accordance with the photo-emf generated by the photovoltaic ferroelectric element.

To read the stored data, a read data impulse is applied at terminal 90 while a read select signal is applied at terminal 92. Due to voltage division between resistor 76 and transistors 70 and 68, a high pulse will be present at read-out terminal 94 if a "1" is stored while a low pulse will be present if a "0" is stored. In the embodiment of FIG. 4, breakdown diode 62 operating in the forward bias, back bias, and breakdown mode accomplishes the function of diodes 42 and 44 of FIG. 3.

Figure 5:
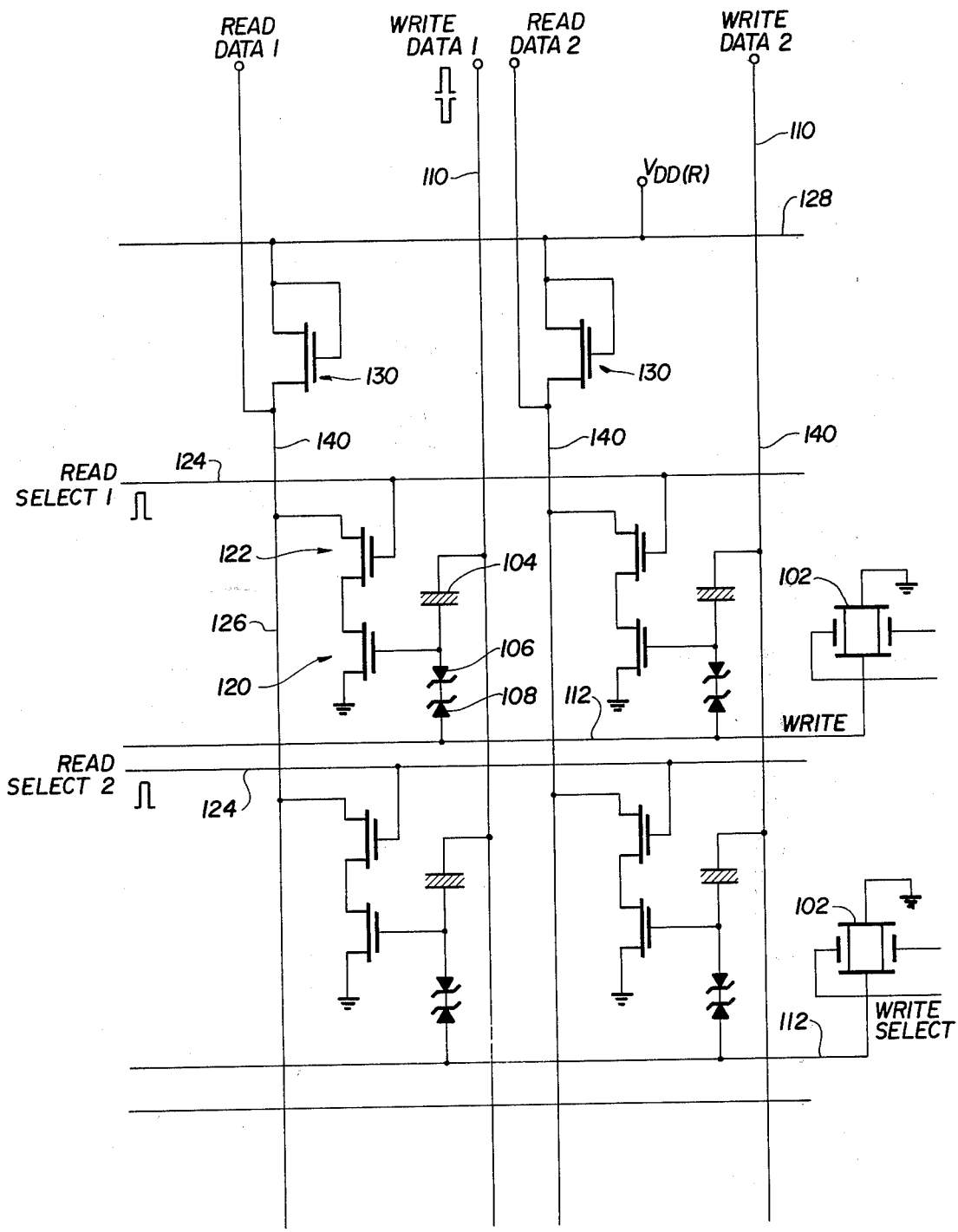
FIG. 5 is a schematic diagram of an EAPROM matrix memory in accordance with a still further embodiment of the invention.

FIG. 5 illustrates an embodiment of an EAPROM matrix memory which utilizes a single pair of off chip switching transistors per line. Referring to the Figure, each matrix row is connected to a respective bilateral switch 102. Each memory cell is comprised of the series combination of a photovoltaic ferroelectric element 104 and a pair of series-connected back-to-back breakdown diodes 106 and 108 connected between vertical matrix write data lines 110 and horizontal matrix write select lines 112. Additionally, the gates of the respective sense transistors 120 are connected to the interconnection of the photovoltaic ferroelectric element and the diodes, and the sense transistor is connected in series with read transistor 122. The gate of each read transistor is connected to a read select line 124 while the source or drain of each read transistor is connected to a read data line 126. Additionally, read signal line 128 is connected to the read data lines through field effect transistors 130 connected as shown which serve as resistive elements in the configuration shown.

To write data into a selected memory cell, a "1" or "0" write data pulse is applied to a selected vertical matrix write data line 110 while a pulse corresponding to the polarity of the data signal is fed to the bilateral switch 102 which is connected in the write select line of the selected memory cell. This causes the photovoltaic ferroelectric element of the selected cell to be switched with the desired signal while the breakdown diode means serve as a low impedance means.

To read data which is stored in a selected memory cell, a steady state voltage level $V_{DD(R)}$ is always applied to read signal line 128 and thereby applies a voltage to each of the read transistors through field effect transistors 130. A read select pulse is then applied to the read select line 124 of the selected memory cell which causes either a high or low pulse to be present at read data terminals 140 depending on whether the cells of the row being read have a "1" or a "0" stored therein. The read data terminal of the column of the selected cell is detected to determine the state of the selected memory cell.

Figure 6:
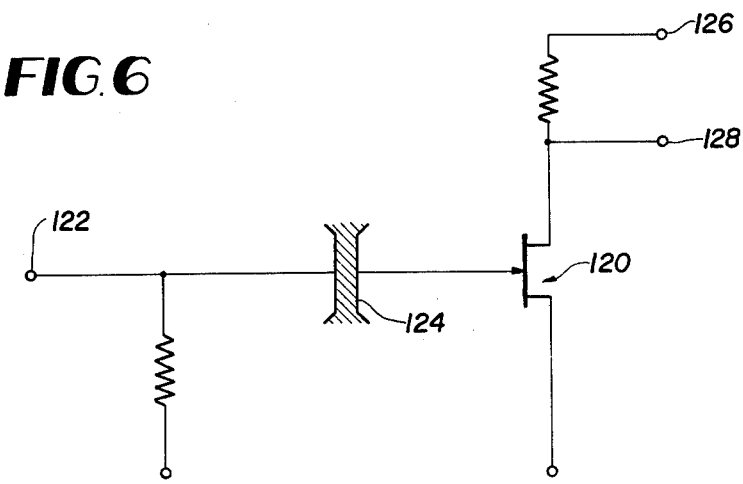
FIG. 6 is a schematic diagram of a memory cell with a JFET in accordance with a still further embodiment of the invention.

As mentioned above, the gate junction of a sense JFET can be utilized as the isolation means of the invention instead of an external diode in combination with an IGFET. A simple memory cell utilizing such an arrangement is shown in FIG. 6 which depicts an n channel JFET 120 wherein the gate is a p region in an n substrate. The gate junction forms an input diode which is back biased by a negative voltage applied at 122 through the resistive leakage across the photovoltaic ferroelectric element 124. The bias is arranged to be large enough to pinch off the drain-source channel so that input read data pulses at 126 appear at the output 128, indicating a "1".

Data is entered by applying a positive or negative voltage pulse to terminal 122. A positive pulse switches element 124 so that illumination then produces a current which further back bias the p type gate and the read output will remain a "1" while a large negative pulse results in breakdown of the input diode, and when the element 124 is illuminated a current flows so as to reduce the back bias at the gate. The decrease in the magnitude of the back bias is sufficient to cause conduction in the drain-source channel and the read data pulse inputted at 126 appears at 128 with a much reduced level, indicating a "0".

Several embodiments of non-volatile matrix memory devices in accordance with the invention have thus been described. It should be appreciated that the disclosed embodiments are illustrative only, and that many variations thereof, for example, the use of varying non-linear impedance devices for the diodes disclosed, are within the spirit and scope of the invention.

I wish it to be understood that I do not desire to be limited to the exact details of construction shown and described, for obvious modifications can be made by a person skilled in the art.

I claim:

1. A memory, comprising,
   solid state switch means capable of assuming one of two states dependent on a bias signal which is to be applied thereto,
   photovoltaic-ferroelectric means for storing information regarding said bias signal, which information is stored in the form of a remanent polarization in one of two possible directions,
   means for writing said information into said photovoltaic-ferroelectric means,
   illumination means for illuminating said photovoltaic-ferroelectric means when it is desired to generate said bias signal,
   means for applying said generated bias signal to said solid state switch means, and
   variable impedance means connected to said photovoltaic-ferroelectric means and said switch means for assuming a relatively low impedance when said information is written into said photovoltaic-ferroelectric means so that a relatively large write voltage appears across said photovoltaic-ferroelectric means and for assuming a relatively high impedance when said bias signal is generated, to allow said bias signal to be effectively applied to said switch means.

2. The memory of claim 1, wherein said solid state switch means includes a control element and said means for writing said information includes signal generating means, and wherein said photovoltaic-ferroelectric means is connected between said signal generating means and said control element.

3. The memory of claim 1, wherein said variable impedance means comprises at least a diode.

4. The memory of claim 3, wherein said at least a diode comprises two diodes.

5. The memory of claim 3, wherein said at least a diode comprises at least a breakdown diode.

6. The memory of claim 5, wherein said at least a breakdown diode comprises a pair of breakdown diodes.

7. The memory of claim 1, wherein said solid state switch means comprises a JFET and wherein said at least a diode comprises the gate junction of the JFET.

8. The memory of claim 1, wherein said means for writing includes bilateral switch means.

9. A matrix memory comprising a plurality of memory cells, each cell being a memory as recited in claim 1.

10. A matrix memory as recited in claim 9, wherein said means for writing includes a bilateral switch means associated with each row or column of memory cells.

* * * * *